United States Patent [19]

Niziolek et al.

[11] Patent Number: 5,382,495
[45] Date of Patent: * Jan. 17, 1995

[54] OVERCOATS FOR DIAZO-CONTAINING LAYERS WITH CHEMICALS AND ABRASION RESISTANCE

[75] Inventors: Thomas C. Niziolek, Agawam; George Hodgins, Granby; Marie B. Ray, Ware, all of Mass.

[73] Assignee: Rexham Graphics, Inc., South Hadley, Mass.

[*] Notice: The portion of the term of this patent subsequent to Jun. 23, 2009 has been disclaimed.

[21] Appl. No.: 694,064

[22] Filed: May 1, 1991

[51] Int. Cl.⁶ .............................................. G03C 1/52
[52] U.S. Cl. ............................. 430/162; 430/157; 430/168; 430/176; 430/273; 430/961
[58] Field of Search ............... 430/162, 176, 157, 273, 430/168, 961

[56] References Cited

U.S. PATENT DOCUMENTS

| | | |
|---|---|---|
| 3,136,637 | 6/1964 | Larson . |
| 3,806,478 | 4/1974 | Mansour et al. ............... 260/17 A |
| 3,868,338 | 2/1975 | Parsons, III et al. ............ 428/412 |
| 4,017,556 | 4/1977 | Wang ............................... 260/856 |
| 4,088,492 | 5/1978 | Pope et al. ........................... 96/75 |
| 4,317,875 | 3/1982 | Scheler et al. ................... 430/162 |
| 4,353,980 | 10/1982 | Helling et al. ................... 430/532 |
| 4,399,192 | 8/1983 | Russell ............................. 428/412 |
| 4,423,100 | 12/1983 | Witman .............................. 428/42 |
| 4,539,349 | 9/1985 | Blount et al. .................... 523/509 |
| 4,543,316 | 9/1985 | Thoese ............................. 430/162 |
| 4,560,639 | 12/1985 | Sullivan ........................... 430/273 |
| 4,714,657 | 12/1987 | Quinn et al. ..................... 428/412 |
| 4,801,508 | 1/1989 | Lutz et al. ....................... 430/162 |
| 4,943,510 | 7/1990 | Thoese et al. ................... 430/162 |
| 4,983,466 | 1/1991 | Witman . |
| 5,124,227 | 6/1992 | Hodgins et al. ................. 430/176 |

FOREIGN PATENT DOCUMENTS 2182337A 5/1987 United Kingdom .

OTHER PUBLICATIONS

Pigment Handbook, vol. 1 pp. 157-159.

Primary Examiner—Charles L. Bowers, Jr.
Assistant Examiner—John S. Chu
Attorney, Agent, or Firm—Burns, Doane, Swecker & Mathis

[57] ABSTRACT

It has surprisingly been found that a protective coating composition for diazo-containing materials can be prepared from a cellulose ester, a hydroxylated resin, a crosslinking agent, microcrystalline silica and an acid catalyst. The coating compositions of the invention provide improved protection for diazo-containing materials from physical and chemical damage. The protective coating compositions of the invention are particularly effective for protecting the diazo-containing materials from chemical attack from solvents. The invention further relates to photographic elements and phototools provided with the protective coating composition and a method for providing the coating composition.

26 Claims, No Drawings

OVERCOATS FOR DIAZO-CONTAINING LAYERS WITH CHEMICALS AND ABRASION RESISTANCE

BACKGROUND OF THE INVENTION

1. Field of the Invention

The present invention relates to coating materials for protecting the surface of diazo-containing materials. More specifically, the invention relates to coating materials which protect the surface of diazo-containing materials from chemical attack and abrasion.

2. Description of Related Art

Diazo-containing materials generally consist of a support carrying a light sensitive diazonium compound. Some diazo-containing materials consist of the diazo material and other layers useful in improving an image to be obtained through the use of the diazo material. Diazo-containing materials are useful for a wide range of applications, including phototool applications in the printed circuit industry, in the production of lithographic plates and for the production of heat-sensitive recording material, among others.

Generally, diazo-containing materials are made by applying a solution of a diazonium compound which may contain other materials such as couplers and optionally a resinous binder to a support. When the support is a plastic film intermediate, anchoring layers may be applied to the film surface to improve adhesion.

When diazo materials comprising a support and a diazonium compound are exposed to a light imagewise, especially ultraviolet (360-440 nm) light, the undecomposed diazonium compound may subsequently be converted into an azo dye thereby providing a recorded image.

Generally, photosensitive diazo materials are developed with water or water vapor, an organic solvent, aqueous or gaseous ammonia or an aqueous solution of a salt after photopolymerization or photodegradation. When moisture, water, various chemicals, foreign particles or fingerprints adhere to the layer of photosensitive diazo material during storage or handling, the utility of the photosensitive material is reduced. Moreover, the surface of the layer of photosensitive diazo material may be easily scratched, locally reducing density, which further decreases utility. In some cases, the diazo-containing material is placed in contact with photoresist or photoimageable soldermask materials which may contain chemicals such as monomers, photoinitiators or solvents which can adversely affect the diazo material. This adverse effect results in either a loss of azo dye density in the image areas or a density build-up in clear areas.

These physical and chemical degradations of photosensitive materials are common problems in the printed circuit industry, particularly in the use of phototools, or photographic masks or stencils bearing a circuit pattern. Such a stencil, which commonly is a diazo film on a polyester base through which a photoresist or soldermask can be exposed, provides an intricate, complex image representing an electrical circuit. The image often consists of many fine lines and junctions spaced closely together. The phototool is used to make printed circuit boards by placing the phototool face down against a photoresist or photoimageable soldermask layer to make a contact print or slightly off contact print by exposing the photoresist or soldermask to high intensity light (360-440 nm) through the phototool. In this way, a single phototool can be used to make up to hundreds of circuit boards.

After initial processing and during use, a phototool must be carefully inspected through a microscope or with automatic optical inspection equipment to insure that there are no breaks in the fine lines of the image which can produce an open circuit in the finished circuit board or unwanted density spots due to particles of dirt or debris which can cause a short circuit. The continued use of the phototool may result in tiny scratches and abrasions on the phototool surface. The photoresists on which the phototool is placed, are usually laminated on copper sheets; small burrs or rough edges of holes bored in the copper sheet can cause scratches as the phototool is transferred from one photoresist to the next. The phototool is frequently wiped with a soft cloth to make sure it is dust and lint free because small particles of dirt can cause scratching as they are wiped across the phototool surface. Because of this general wear and tear on the phototool surface during normal use, the phototool must be frequently reinspected (after 20 to 50 exposures) to insure line continuity and overall phototool integrity. Depending on the size and the intricacy of the phototool, manual microscopic inspections can take up to 2 to 3 hours.

Contact with the photoresist or soldermask also presents various opportunities for the phototool to be damaged chemically by materials remaining in the photoresist or soldermask. In particular, materials remaining in the photoresist or soldermask which are contacted with the phototool can chemically damage the phototool. Further, materials used to clean the phototool or the photoresist or soldermask, such as solvents, may attack the phototool, affecting densities on the surface.

In all cases, overcoats on photographic products must meet exacting requirements with respect to transparency, flexibility, adhesion, and thickness. But, in the case of phototools, even stricter requirements must be met. For example, phototools often require resolutions greater than one line pair/3 mil (76.2 micrometers). In addition, the thickness of the overlay may cause parallax during contact printing resulting in poor wall quality in the final printed circuit.

One method of protecting diazo layers was disclosed in U.S. Pat. No. 3,136,637, issued to Larson, which describes plate or sheet structures comprising a base sheet having coated thereon a stable light-sensitive resin layer such as a light-sensitive diazo resin. Coated over and in contact with the light-sensitive material is an actinic light-transmitting film or layer of a hydrophobic water-insoluble solvent-softenable resin. The processing solutions disclosed remove unexposed diazo-resin-/overcoat resin areas. They do not produce azo dye images. Further, these resins show poor permeability to ammonia and water vapor used to produce azo dye images.

U.S. Pat. No. 4,088,492, issued to Pope et. al., describes the incorporation of hydroxyalkyl cellulose ether in a diazo-type sensitizing coating composition or as an overcoat in order to permit rapid release of nitrogen during light exposure and to reduce slippage during roll-to-roll printing of diazo film materials. This coating increases roughness and would increase, rather than decrease, abrasion.

In some cases, in order to prevent damage, users of diazo phototools laminate an adhesive-backed clear polyester layer on top of the diazo layer after processing the diazo image. This protective polyester film is expensive and requires a lamination step which often traps foreign particles and air between the clear polyester film and the diazo surface. The adhesive may also increase background density during successive light exposure to photoresist.

Commonly assigned U.S. Serial No. 494,212, filed Mar. 15, 1990, discloses ammonia and water permeable protective coating compositions for diazo-containing materials of cellulose esters and microcrystalline silica which provide abrasion resistance. These compositions, however, are still susceptible to chemical attack.

Compositions which have abrasion and/or chemical resistance are found in the art for various uses. However, each of these composition formulations lacks the necessary properties to be used for protective coatings for diazo-containing materials.

Mansour et. al., U.S. Pat. No. 3,806,478, relates to protective coatings for paints particularly useful on metal which include an organic liquid medium, a cellulosic precursor and a dispersion polymer of ethylenically unsaturated monomers.

Parsons et. al., U.S. Pat. No. 3,868,338, relates to a thermosetting polyester powder coating composition including polyester, cellulose acetate butyrate, a crosslinking agent, particularly melamine-formaldehyde and a catalyst, particularly p-toluenesulfonic acid.

Quinn et. al., U.S. Pat. No. 4,714,657, discloses thermoplastic articles protected by mar and solvent resistant coatings containing an aminoplast, a polyester polyol, a catalyst, reaction stabilizers and ultraviolet stabilizers.

Wang, U.S. Pat. No. 4,017,556, describes coatings of urethane prepolymer, alkylated melamine/formaldehyde, and an acid catalyst. The resulting coatings have mar resistance, clarity and impact resistance.

GB 2 182 337 relates to surface coverings for floors containing a melamine aminoplast, a vinyl modifier resin, a polyol and an acid catalyst. These coverings are alleged to have resistance to common household stains and improved scratch resistance.

Witman, U.S. Pat. No. 4,983,466, describes floor coverings of cellulose acetate propionate or butyrate, an aminoplast, a polyol, an acid catalyst and chlorinated polyolefin. These coverings provide improved stain and scratch resistance.

Compositions for protecting photographic materials from liquids or solutions such as coffee or ink are disclosed in Helling et. al., U.S. Pat. No. 4,353,980. These compositions include an irradiation-hardening binder, a multifunctional acrylic monomer, diiso- or polyisocyanate and a photoinitiator.

Actinic radiation curable coating compositions which provide abrasion resistant coatings and resistance to attack by chemical and organic solvents are described in Russell, U.S. Pat. No. 4,399,192. The compositions include pentaerythritol tetraacrylate, cellulose ester and a photoinitiator, such as benzoyl peroxide.

None of these compositions provide satisfactory characteristics for protection of diazo-containing materials.

Thus, there is a need in the art for a composition useful for coating diazo-containing materials to protect the diazo-containing material from chemical and physical damage. Particularly, there is a need in the art to provide a composition useful for coating diazo-containing materials to at least partially protect the diazo-containing material from chemical attack. Further, there is a need in the art for an efficient and economical protective coating for diazo-containing materials.

SUMMARY OF THE INVENTION

The present invention relates to a protective coating composition for diazo-containing materials comprising diazo-protecting amounts of a cellulose ester, a hydroxylated resin, a crosslinking agent, microcrystalline silica and an acid catalyst, the coating composition being permeable to water vapor and ammonia vapor.

The invention further relates to a photographic element comprising a support, a diazo-containing material and a water vapor and ammonia vapor permeable coating composition which provides a protective coating for the diazo-containing material comprising a cellulose ester, a hydroxylated resin, a crosslinking agent, microcrystalline silica and an acid catalyst.

In a further embodiment, the invention relates to a phototool comprising a support, a bond coating, a diazo-containing layer and a water vapor and ammonia vapor permeable coating composition which provides a protective coating for the diazo-containing layer comprising a cellulose ester, a hydroxylated resin, a crosslinking agent, microcrystalline silica and an acid catalyst.

In a further embodiment, the invention relates to a method for providing a protective coating on a diazo-containing material comprising coating at least a surface of the diazo-containing material with a composition comprising a cellulose ester, a hydroxylated resin, a crosslinking agent, microcrystalline silica and an acid catalyst, and drying the coating at a temperature of about 225° F. to about 275° F. for about 30 seconds to about one minute.

DETAILED DESCRIPTION OF THE PREFERRED EMBODIMENTS

It surprisingly has been found that a protective coating composition for diazo-containing materials can be prepared from a cellulose ester, a hydroxylated resin, a crosslinking agent, microcrystalline silica and an acid catalyst. The coating compositions of the invention provide improved protection for diazo-containing materials from physical and chemical damage. The protective coating compositions of the invention are particularly effective for protecting the diazo-containing materials from chemical attack from solvents as well as retained solvents and chemicals confined in photoresist and soldermask coated boards.

The protective coatings produce excellent overcoat layers which meet the strict requirements necessary for many diazo applications, including the requirements for diazo-containing phototools. The protective coatings show good adhesion to the diazo film surface, maintain a discreet layer without significantly penetrating the diazo-containing layer and are permeable to both ammonia vapor and water vapor. Further, the protective coatings provide clear and transparent coatings in both visible and actinic light and maintain clarity during repeated exposure to ultraviolet light. Moreover, the protective coatings provide the above advantages while also producing a hard, abrasion/scratch resistant protective layer for the diazo-containing material. Finally, the protective coatings provide protection from degradation of the diazo-containing material by solvents. This allows the density of the diazo-containing material to be maintained so that the background areas do not suffer a density build-up ($D_{min}$ increase) and the azo dye areas do not suffer a loss of density ($D_{max}$ loss).

The ability of the protective coating compositions to protect diazo-containing material may be measured by a number of known methods. An abrasion resistance test can be used to illustrate the percent optical density retained after the protective coating composition receives a specified number of abrasive strokes. The protective coating composition of the present invention generally will have above about 95 percent density remaining after 100 abrasive strokes with #2 steel wool. Preferably, the protective coating composition will have about 100 percent density remaining after 100 abrasive strokes with #2 steel wool.

A solvent resistance test may be conducted to determine the amount of density ($D_{max}$) remaining after a specified number of rubs with a solvent. The test typically will be conducted after preparation and application of the protective coating composition to a diazo-containing material and again after a certain period of aging to determine the shelf-life of the protective coating composition. The $D_{max}$ loss, as measured by a densitometer, in a preferred embodiment is 0%; however, a loss below about 5% is considered acceptable and is generally obtained by use of the protective coating compositions of the present invention.

A development rate test may be conducted to illustrate the water vapor and ammonia vapor permeability through the protective resin layer. More than one pass through the developer may be conducted in order to determine the actual permeability of the protective coating composition. The protective coating composition of the present invention generally will provide a development rate of above about 95% after the second pass. In a preferred embodiment, the protective coating composition provides a development rate of above about 98% after the second pass through the developer.

Density build-up or the $D_{min}$ increase may be tested by placing processed material in an oven at 50° C. for 7 days to simulate natural aging of over one year. The absorbance is measured by a densitometer to determine the amount of uv light which passes through the transparent areas of the material. Typically, the $D_{min}$ will be about 0.30 log density units and below with the protective coating compositions of the present invention. In a preferred embodiment, the protective coating composition provides a $D_{min}$ below about 0.25 log density units.

The ability to produce an abrasion, solvent and chemically resistant protective coating layer, and yet maintain the necessary selective permeability to ammonia vapor and water vapor is surprisingly obtained by combining diazo-protecting amounts of a cellulose ester, a hydroxylated resin, a crosslinking agent, microcrystalline silica and an acid catalyst. In order to protect diazo-containing compositions, the coating substantially prevents penetration of solvents, substantially reduces the penetration rate of chemical components of photoresists or soldermasks, provides abrasion resistance, remains transparent and colorless during successive exposures to light and heat and produces little or no discoloration of the unimaged areas of the diazo-containing layer. Moreover, such a coating permits selective penetration of ammonia vapor and water vapor during development.

Without wishing to be bound by any theory, it is believed that when the cellulose ester and hydroxylated resins are combined in diazo-protecting amounts, the cross-linking interaction with low temperature cure crosslinking agents occurs rapidly and completely during the coating and drying operation, and little or no low temperature cure crosslinking agent remains to react with the diazo-containing layer.

The cellulose esters useful for preparing the protective coating compositions of the present invention include those esters which may be generically called organic esters of cellulose. These esters are prepared by treating cellulose with a mixture of an acid and its anhydride or mixtures of organic acids and organic anhydrides. Useful cellulose esters include the cellulose acetates, cellulose propionates, cellulose acetate propionates, cellulose acetate butyrates or cellulose triacetates. These cellulose esters may be obtained from Eastman Chemicals, see Publication no. P-160F, January, 1989. In the preferred embodiment, a cellulose acetate propionate (CAP) is used in the protective coating composition. Although any of the cellulose esters described may be used, cellulose acetate propionates have been found to provide the best results. Although not wishing to be bound by any theory, it is believed that cellulose acetate butyrates (CAB) are not as preferable since hydrolysis of CAB produces butyric acid which is olefactorily more undesirable than the propionic acid produced through hydrolysis of CAP. Moreover, the CAP resins typically provide a superior combination of solubility, glass transition temperature and Tukon hardness.

The amount of cellulose ester in the protective coating composition will depend on its solubility, viscosity and wet/dry coat thickness desired. The cellulose ester is provided in an amount sufficient to provide protection of diazo-containing material, in conjunction with the other components of the protective coating composition. If not enough cellulose ester is provided, the diazo-containing materials will suffer from poor development. If an excess of cellulose ester is used, the resulting coating composition will have poor solvent and chemical resistance. Typically, the diazo-protecting amount of cellulose ester will range from about 4 to about 15 parts per 100 parts of cellulose ester in the wet film. In a preferred embodiment, the coating composition will contain about 10 to about 12 parts per 100 parts cellulose ester in the wet film.

The hydroxylated resins useful in the present compositions may be any hydroxy-containing polymers compatible with the other components of the composition and diazo-containing materials and capable of providing the desired properties to the protective coating composition. The hydroxy groups provide cross-linkable groups which react with the crosslinking agent. Hydroxylated resins which may be used in the present composition are known in the art and are commercially available. Preferably, the hydroxylated resins are hydroxylated acrylic resins, or hydroxy-containing polymers of acrylic acid. Commercially available hydroxylated acrylic resins may be obtained from Allied Colloids, Inc. under the trade name Surcol, from Johnson Wax/Specialty Chemical under the trade name Joncryl and from King Industries under the trade name Kflex.

The amount of hydroxylated resin in the protective coating composition will depend on a variety of factors, including the number of cross-linkable groups in the chosen compound and overall compatibility with the other components and diazo-containing material. Typically, the hydroxylated resin will be present in an amount effective for protecting diazo-containing material in conjunction with the other components of the protective coating composition. If the amount of hydroxylated resin is too low, the coating composition will have poor alcohol and chemical resistance. If the amount of hydroxylated resin is too high, the diazo material will suffer from poor development. The diazo protecting amount of resin material is generally an amount of about 2 to about 10 parts per 100 parts in the wet film. In a preferred embodiment, the protective coating composition will contain the resin material in an amount of about 3 to about 6 parts per 100 parts in the wet film.

The crosslinking agent generally will be any agent which effects attachment of two chains of polymer molecules by bridges, or crosslinks the polymer molecules. Preferably, the crosslinking agent is a hydroxyl group crosslinking agent which can effect crosslinking at temperatures below about 275° F. The crosslinking agents can be any of the melamine resins, including but not limited to melamine/formaldehyde, and hexamethoxymethylmelamine/styrene allyl alcohol resins. These resins are commercially available as Cymel crosslinking agents from American Cyanamid and Resimene TM crosslinking resins from Monsanto Chemical Co. In a preferred embodiment, a melamine resin of hexamethoxymethylmelamine/styrene allyl alcohol is used.

The amount of crosslinking agent will depend on the degree of crosslinking required, as well as overall compatibility. If not enough of the crosslinking agent is present, the protective coating will have poor solvent and chemical resistance. If excess crosslinking agent is used, the development of the diazo-containing material will be negatively affected. Generally, the diazo protecting amount of crosslinking agent will be an amount of about 2.25 to about 10 parts per 100 parts in the wet film. Preferably, the crosslinking agent will be present in an amount from about 2.25 to about 4 parts per 100 parts in the wet film.

The acid catalysts useful in the protective coating compositions are generally organic acids. Examples of such acid catalysts are known in the art and include sulfonic acids, such as methanesulfonic acid, sulfosalicylic acid and p-toluenesulfonic acid, and other acids such as citric acid, maleic acid, phthalic acid, etc. These catalysts have been found necessary in conjunction with the low temperature cure crosslinking resins in order to obtain the desired coating characteristics. Moreover, the organic acids have been found to protect the diazo layer from chemical attack from ambient ammonia or amines which can cause precoupling of the diazonium and couplers to produce the azo dye during storage or use. Although not wishing to be bound by any theory, it is believed that the acid may act as an "interceptor" or "scavenger" for volatile alkaline materials and neutralize them before the materials reach the diazo-containing layer. P-toluenesulfonic acid (PTSA) is used in the preferred embodiment of the protective coating composition.

The amount of acid catalyst in the protective coating composition will depend on the degree and speed of crosslinking required. Typically, the acid catalyst will be present in an amount effective for protecting diazo-containing materials, in conjunction with the other components of the protective coating composition. Generally, the diazo-protecting amount of acid catalyst will be an amount from about 0.50 to about 1.5 parts per 100 parts in the wet film. Preferably, the acid catalyst will be present in an amount from about 0.55 to about 1.0 parts per 100 parts in the wet film.

Microcrystalline silica is used in the coating composition in order to improve abrasion resistance, as described in commonly assigned U.S. application Ser. No. 494,212, filed Mar. 15, 1990, incorporated herein by reference. The microcrystalline silica useful in the coating compositions of the present invention may be a microcrystalline silica which is about 0.10 to about 15 microns in size derived from quartzite sand, sandstone, tripoli or novaculite. In particular, microcrystalline novaculite (novacite) silica which is about 0.10 to about 10.0 microns is preferred. A description of novaculite may be found in *Pigment Handbook,* T. C. Patton, Volume 1, pp. 157–159, Wiley, (1973).

It also is preferred that the microcrystalline silica used have a hardness level sufficient to improve abrasion-resistance. The silica preferably will have a hardness greater than 6 on the Mohs hardness scale. Novacite silica has a Mohs hardness of 7. Although not wishing to be bound by any theory, in addition to significantly improving abrasion/scratch resistance, it is believed that the microcrystalline silica reduces or eliminates blocking or bricking of the diazo-containing materials and expedites the removal of air between the phototool and photoresist or soldermask surfaces during contact light exposure of the photoresist or soldermask material. Blocking and bricking is the tendency for a film to adhere to itself or whatever it is in contact with.

The amount of silica in the protective coating composition generally depends on surface roughness required to permit rapid air removal, in a vacuum frame for example, between phototool and photoresist or soldermask surface, the resolution requirement of photoresist or soldermask and the desired abrasion resistance. The microcrystalline silica should be used in an amount sufficient to improve the abrasion resistance of the diazo-containing materials without significantly adversely affecting the transparency of the protective coating composition. Moreover, the amount of microcrystalline silica should be such that abrasion-resistance is improved without significantly reducing resolution and acuity of the diazo-containing material or any image produced therefrom. For example, when the protective coating compositions are used on phototools, the resolution and acuity of the photoresist image should not be significantly reduced from the use of microcrystalline silica in the protective coating compositions. Preferably, a diazo-protecting amount of microcrystalline silica will range from about 0.05 parts to about 5 parts per 100 parts in the wet film. Most preferably, the coating compositions will contain about 0.1 parts to about 1 part per 100 parts of microcrystalline silica in the wet film.

The protective coating composition will typically also contain certain solvents, such as acetone, methanol, propylene glycol monomethyl ether, butyl acetate, ethane, and methyl ethyl ketone. The solvents used should be capable of being driven from the protective coating composition during a drying step after application of the composition to the diazo-containing material. These solvents generally will be present in an amount from about 5 to about 50 parts per 100 parts in the wet film. Preferably, these solvents will be present in an amount from about 7 to about 40 parts per 100 parts in the wet film.

In addition to the cellulose ester, hydroxylated resin, crosslinking agent, microcrystalline silica and acid catalyst, it may be desirable to add an adhesive-type compound to the protective coating composition. The addition of an adhesive or release compound has been found to provide additional improvement of the protective coating with respect to physical scratching, and, in some instances, chemical attack. These adhesive or release compounds which include materials which produce low energy surfaces include silicones, fluorinated polymers or waxes. In particular, suitable adhesive compounds are polysiloxanes and related silicone-based materials, such as silicone resins. A particularly preferred group of adhesive-type compounds are organo-modified silicone resins. These resins are commercially available from various vendors, including Dow Corning.

The adhesive compound generally will be present in the protective coating composition in an amount of about 0 parts to about 1 part per 100 parts in the wet film. Preferably, the adhesive compound is present in an amount of about 0.05 parts to about 0.25 parts per 100 parts in the wet film.

Other components may be present in the protective coating compositions which do not detract from the properties of the compositions as described above. Examples of such components include surfactants or matting agents.

The protective coating compositions of the present invention typically are prepared by dissolving the various components in suitable solvents using conventional mixing and dispersing equipment. Generally, the hydroxylated resin will be dissolved in the solvent blend until a clear solution results before adding the remaining components to the resin solution.

The protective coating compositions of the invention may be used in any application in which a diazo-containing material requires durability or abrasion/scratch resistance. Examples of such applications include, among others, the preparation of photographic elements, microfilm, overhead transparencies, phototools, lithographic printing plates and photoresist. The protective coating compositions are particularly useful for phototool elements.

In one embodiment of the invention, a method for providing a protective coating on a diazo-containing material is provided comprising coating at least the surface of the diazo-containing material with a composition comprising a cellulose ester, a hydroxylated resin, a crosslinking agent, microcrystalline silica and an acid catalyst. The coating then is dried to remove the solvents from the coating.

The diazo-containing material in one embodiment is part of a photographic element. In a preferred embodiment, the photographic element is a phototool which may be prepared by any method known in the art. The diazo-containing phototool may be prepared by applying a diazo-containing lacquer to a transparent film base and evaporating the solvents to produce a continuous diazo-containing layer on the prebonded clear substrate. Typically, a support material, such as polyester or polyethylene terephthalate (PET) will be coated with a layer of diazo-containing material. The protective coating composition then is coated by any known coating procedure, such as gravure, reverse roll, between-the-rolls, direct offset, extrusion or wire-wound rod or with a coating bar to the preferred thickness. The coated diazo-containing material then may be dried by any standard procedure. However, it has been discovered that controlling the drying temperature and coating speed can result in protective coating compositions with excellent characteristics. The typical drying temperature is about 225° F. to about 275° F. Preferably, the drying temperature is about 250° F. to about 275° F. The dwell time for the coated diazo-containing material generally is about 30 seconds to about 1 minute. In a preferred embodiment, the dwell time is about 45 to about 55 seconds.

The dry film thickness of the protective coating should be adjusted to provide maximum scratch/abrasion and chemical protection, while allowing full development of the azo dye image within two to three passes through a commercial developing device. Preferably, the dry film thickness of the protective coating will range from about 0.10 mil to about 0.30 mil. In the most preferred embodiment, the dry film thickness of the protective coating will range from about 0.15 mil to about 0.25.

A typical phototool will have a support material such as PET, a bond coating, a diazo-containing layer and a protective layer.

The following examples are provided to further illustrate the invention, but are not meant to limit the scope of the invention in any way.

EXAMPLES

CONTROL EXAMPLE 1

Table 1 shows the composition of the formulation of Control Example 1. Hydroxylated acrylic resin as shown in Table I was dissolved in the solvent blend until a clear solution resulted. Control Example 1 did not contain a crosslinking agent. The remaining components were then added to the resin solution.

A support material of 7 mil prebonded polyethylene terephthalate film then was coated with a layer of diazo-containing material, at 10μ dry film thickness. The diazo-containing material contained 14.28% solids. The diazo formulation included 38.58% methyl ethyl ketone as a solvent, 38.58% methanol as a solvent, 8.56% ethylene glycol monomethyl ether as a solvent, 0.009% 5-sulfosalicylic acid as a stabilizer, 0.17% zinc chloride as a stabilizer, 1.44% resorcinol as a coupler, 10.6% cellulose ester resin as a binder and 1.99% 4-dialkylamino benzene diazonium fluoroborate as the light-sensitive ingredient. The surface of the diazo-containing material then was coated with the protective coating composition by a Baker coating bar to a wet film thickness of 4 mil. The control sample then was dried for about one minute at about 225° F. in an air circulated oven, (Blue M Electric Company, Model Powermatic 70). The dry film thickness of the protective layers was 0.15±0.01 mils (3.75±1μ).

The sample was then imaged using an exposure device such as a Berkey ASOR vacuum printer. The ammonia developer was the Tecnifax model 6000 Dry Developer. The test master was placed over the standard diazo control material, being sure the sensitized side of the sample was toward the light source. The exposure time was then determined so as to give a density in the first step of a standard 21 step photographic step wedge of between 0.05 and 0.10 density units.

The sample then was fully developed in the Model 6000 Dry Developer to form the azo dye print using the proper exposure time as determined by the standard.

The sample was tested for development rate and solvent resistance before and after 7 days aging at 50° C. The development rate illustrates the water vapor and ammonia vapor permeability through the protective resin layer. The solvent resistance test illustrates the amount of density remaining after a specified number of rubs with isopropanol.

Table 2 shows the results of the various tests on the sample. Control example 1, which contained no low temperature cure crosslinking agent, showed complete loss of image in the isopropanol rub test.

CONTROL EXAMPLE 2

A coating composition was prepared, coated onto diazo-containing material, and tested as described in Control Example 1 using the formulation shown in Table 1. The sample did not contain a crosslinking agent. The results of the tests relating to development rate and solvent resistance are in Table 2 and show that Control Example 2 had a complete loss of image from the isopropanol rub test.

COMPARATIVE EXAMPLE 1

A coating composition was prepared, coated onto diazo-containing material, and tested as described in Control Example 1 using the formulation shown in Table 1. Relatively low amounts of each of the hydroxylated acrylic resin, the crosslinking agent and the acid catalyst were employed. As shown in Table 2, the use of these components provided improvement over the control samples, but the coating composition still suffered from chemical attack.

COMPARATIVE EXAMPLE 2

A coating composition was prepared, coated onto diazo-containing material, and tested as described in Control Example 1 using the formulation shown in Table 1. Relatively low amounts of each of the hydroxylated acrylic resin and the crosslinking agent were employed. As shown in Table 2, this composition provided improvement over the control samples, but the samples suffered unacceptable chemical attack from the isopropanol rub.

COMPARATIVE EXAMPLE 3

A coating composition was prepared, coated onto diazo-containing material, and tested as described in Control Example 1 using the formulation shown in Table 1. Relatively low amounts of each of the hydroxylated acrylic resin and acid catalyst were employed. As shown in Table 2, this composition provided improvement over the control samples, but the sample suffered unacceptable chemical attack from the isopropanol rub.

COMPARATIVE EXAMPLE 4

A coating composition was prepared, coated onto diazo-containing material, and tested as described in Control Example using the formulation shown in Table 1. Relatively low amounts of each of the crosslinking agent and the acid catalyst were employed. As shown in Table 2, this composition provided improvement over the control samples, but the $D_{min}$ was 0.97 and the development rate after two passes through the developer was only 77% before aging.

COMPARATIVE EXAMPLE 5

A coating composition was prepared, coated onto diazo-containing material, and tested as described in Control Example 1 using the formulation shown in Table 1. Relatively high amounts of each of the hydroxylated acrylic resin and the acid catalyst were employed. As shown in Table 2, this composition completely protects the underlying diazo-containing layer from the effects of isopropanol. However, the development rate was only 52% after two passes through the developer before aging.

COMPARATIVE EXAMPLE 6

A coating composition was prepared, coated onto diazo-containing material, and tested as described in Control Example 1 using the formulation shown in Table 1. Relatively high amounts of each of the hydroxylated acrylic resin and the crosslinking agent were employed. As shown in Table 2, this composition completely protects the underlying diazo-containing layer from the effects of isopropanol. However, the development rate was only 48% after two passes through the developer before aging.

COMPARATIVE EXAMPLE 7

A coating composition was prepared, coated onto diazo-containing material, and tested as described in Control Example 1 using the formulation shown in Table 1. Relatively high amounts of each of the hydroxylated acrylic resin, the crosslinking agent and the acid catalyst were employed. As shown in Table 2, this composition completely protects the underlying diazo-containing layer from the effects of isopropanol. However, the development rate was only 50% after two passes through the developer before aging.

EXAMPLE 1

A coating composition was prepared, coated onto diazo-containing material, and tested as described in Control Example 1 using the formulation shown in Table 1. Relatively high amounts of each of the crosslinking agent and the acid catalyst were employed. As shown in Table 2, this composition completely protects the underlying diazo-containing layer from development, $D_{max}$ loss and $D_{min}$ stability. the effects of isopropanol. Moreover, this composition provided a good combination of improved solvent resistance, development, $D_{max}$ loss and $D_{min}$ stability.

TABLE 1

| Component | 1 Control | 2 Control | 1 Comp. | 2 Comp. | 3 Comp. | 4 Comp. | 5 Comp. | 6 Comp. | 7 Comp. | 1 Ex. |
|---|---|---|---|---|---|---|---|---|---|---|
| Acetone | 39.5 | 39.5 | 39.7 | 39.7 | 39.3 | 34.96 | 34.96 | 34.10 | 34.10 | 39.3 |
| Methanol | 39.5 | 39.5 | 39.7 | 39.7 | 39.3 | 34.96 | 34.96 | 34.10 | 34.10 | 39.3 |
| Propylene Glycol Monomethyl ether | 8.85 | 8.85 | 8.85 | 8.85 | 8.72 | 7.76 | 7.76 | 7.57 | 7.57 | 8.72 |
| Cellulose Acetate Propionate 482-20 | 10.8 | 5.38 | 4.05 | 4.05 | 4.05 | 4.05 | 4.05 | 4.05 | 4.05 | 4.05 |
| Resimene 797 | | | 2.02 | 2.02 | 2.84 | 4.05 | 4.05 | 5.67 | 5.67 | 2.84 |
| Microcrystalline Silica | .10 | .10 | .10 | .10 | .10 | .10 | .10 | .10 | .10 | .10 |
| P-Toluene Sulfonic Acid | .10 | .10 | .45 | .55 | .48 | .89 | 1.09 | .96 | 1.18 | .60 |

TABLE 1-continued

| Component | 1 Control | 2 Control | 1 Comp. | 2 Comp. | 3 Comp. | 4 Comp. | 5 Comp. | 6 Comp. | 7 Comp. | 1 Ex. |
|---|---|---|---|---|---|---|---|---|---|---|
| Silicone Flow Agent DC-54 (organo modified silicone) | .10 | .10 | .10 | .10 | .10 | .10 | .10 | .10 | .10 | .10 |
| Hydroxylated Acrylic Copolymer DP6-4665 | | 5.38 | 4.05 | 4.05 | 4.05 | 12.15 | 12.15 | 12.15 | 12.15 | 4.05 |

TABLE 2

| Example | Initial IPOH Rub % D-Max Loss | D-Max (log density units) | D-min (log density units) | Dev Rate | 7 Day Aged @ 50 C. | | | | |
|---|---|---|---|---|---|---|---|---|---|
| | | | | | D-Max | % Loss | D-min | % Gain | Dev Rate |
| 1 Control | 100 | 4.66 | .07 | 98/100 | 4.23 | 9.2 | .32 | 357 | 97/98 |
| 2 Control | 100 | 4.55 | .08 | 95/99 | 4.15 | 9.6 | .31 | 288 | 90/98 |
| 1 Comparative | 15 | 3.90 | .12 | 92/96 | 3.67 | 6 | .33 | 345 | 98/99 |
| 2 Comparative | 9.5 | 4.47 | .14 | 92/97 | 3.57 | 20 | .28 | 100 | 95/97 |
| 3 Comparative | 14 | 4.27 | .14 | 61/85 | 3.59 | 16 | .34 | 140 | 100/100 |
| 4 Comparative | 0 | 4.43 | .14 | 53/77 | 3.80 | 14 | .97 | 590 | 85/87 |
| 5 Comparative | 0 | 3.78 | .13 | 49/52 | 3.32 | 12 | .42 | 130 | 74/86 |
| 6 Comparative | 0 | 4.30 | .16 | 46/48 | 3.44 | 20 | 1.08 | 560 | 76/78 |
| 7 Comparative | 0 | 4.42 | .15 | 44/50 | 3.62 | 18 | .80 | 430 | 60/69 |
| 1 Example | 0 | 4.44 | .13 | 76/94 | 3.40 | 23 | .31 | 138 | 78/83 |

EXAMPLES 2-10

Table 3 shows the composition of 9 formulations of protective coating compositions according to the present invention. The formulations were prepared, coated and tested as in Control Example 1, except that examples 2-6 were dried for about 45-50 seconds at about 260° F. and examples 7-10 were dried for about 45-50 seconds at about 275° F. Table 4 shows the results of the tests conducted on the 9 formulations, illustrating the excellent properties of the protective coating compositions.

From the foregoing description, various modifications and changes in the coating composition or method of proving a protective coating composition will occur to those skilled in the art. All such modifications coming within the scope of the appended claims are intended to be included therein.

TABLE 3

| Example | 2 | 3 | 4 | 5 | 6 | 7 | 8 | 9 | 10 |
|---|---|---|---|---|---|---|---|---|---|
| Acetone | 35.87 | 36.52 | 36.55 | 36.76 | 36.79 | 36.94 | 36.91 | 36.68 | 36.71 |
| Methanol | 35.87 | 36.52 | 36.55 | 36.76 | 36.79 | 36.94 | 36.91 | 36.68 | 36.71 |
| Propylene Glycol Monomethyl ether | 7.96 | 8.12 | 8.13 | 8.16 | 8.17 | 8.21 | 8.2 | 8.14 | 8.15 |
| Silicone Flow Agent DC-54 | .10 | .10 | .10 | .10 | .10 | .10 | .10 | .10 | .10 |
| Resimene 797 | 3.54 | 3.00 | 3.00 | 3.00 | 2.66 | 2.66 | 2.66 | 2.66 | 2.66 |
| CAP | 10.52 | 10.52 | 10.52 | 10.52 | 10.52 | 10.52 | 10.52 | 10.52 | 10.52 |
| Hydrox. Acrylic Copolymer | 5.23 | 4.44 | 4.44 | 3.92 | 3.92 | 3.92 | 3.92 | 4.44 | 4.44 |
| Microcrystalline Silica | .16 | .16 | .16 | .16 | .16 | .16 | .16 | .16 | .16 |
| PTSA | .73 | .62 | .55 | .62 | .55 | .55 | .62 | .62 | .55 |
| % Total Solids | 20.28 | 18.84 | 18.77 | 18.32 | 18.25 | 17.91 | 17.98 | 18.50 | 18.43 |
| % crosslinker on resin | 17.46 | 15.92 | 15.98 | 16.38 | 16.44 | 14.85 | 14.79 | 14.38 | 14.43 |
| % catalyst on resin | 3.60 | 3.29 | 2.93 | 3.38 | 3.01 | 3.07 | 3.45 | 3.35 | 2.98 |

TABLE 4

| Results - 7 Day Aged | Example | | | | | | | | |
|---|---|---|---|---|---|---|---|---|---|
| | 2 | 3 | 4 | 5 | 6 | 7 | 6 | 9 | 10 |
| D-Min | .22 | .21 | .19 | .16 | .22 | .19 | .25 | .16 | .26 |
| | .22 | .22 | .19 | .17 | .20 | .19 | .24 | .15 | .26 |
| D-Max | 3.90 | 3.88 | 4.31 | 3.95 | 3.90 | 4.04 | 3.95 | 3.99 | 3.60 |
| | 3.93 | 3.88 | 4.15 | 4.13 | 3.91 | 4.00 | 3.92 | 3.95 | 3.60 |
| 300 IPOH rub % D-Max loss | 2.16 | .06 | 1.72 | .43 | 1.29 | 1.95 | 0 | 1.08 | 2.59 |

We claim:

1. A photographic element comprising a support, a diazo-containing layer and a water vapor and ammonia vapor permeable protective coating over the diazo-containing layer comprising a cellulose ester, a hydroxylated resin, a crosslinking agent, microcrystalline silica and an acid catalyst.

2. The photographic element of claim 1 wherein the hydroxylated resin is a hydroxylated acrylic resin.

3. The photographic element of claim 2 wherein the cellulose ester is a cellulose acetate propionate, cellulose acetate butyrate or cellulose acetate.

4. The photographic element of claim 3 wherein the cellulose ester is a cellulose acetate propionate.

5. The photographic element of claim 2 wherein the crosslinking agent is a melamine crosslinking agent.

6. The photographic element of claim 5 wherein the crosslinking agent is a melamine resin of hexamethoxymethylmelamine/styrene allyl alcohol.

7. The photographic element of claim 2 wherein the acid catalyst is p-toluenesulfonic acid.

8. The photographic element of claim 2 wherein the coating composition further comprises an adhesive compound.

9. The photographic element of claim 8 wherein the adhesive compound is an organo modified silicone resin.

10. The photographic element of claim 2 wherein the hydroxylated acrylic resin is present in an amount of about 2 to about 10 parts per 100 parts in a wet film and the crosslinking agent is present in an amount of about 2.25 to about 10 parts per 100 parts in a wet film.

11. A phototool comprising a support, a bond coating, a diazo-containing layer and a water vapor and ammonia vapor permeable coating composition which provides a protective coating for the diazo-containing layer comprising a cellulose ester, a hydroxylated resin, a crosslinking agent, microcrystalline silica and an acid catalyst.

12. The phototool of claim 11, wherein the hydroxylated resin is a hydroxylated acrylic resin.

13. The phototool of claim 12 wherein the cellulose ester is a cellulose acetate propionate, cellulose acetate butyrate or cellulose acetate.

14. The phototool of claim 13 wherein the cellulose ester is a cellulose acetate propionate.

15. The phototool of claim 12 wherein the crosslinking agent is a melamine crosslinking agent.

16. The phototool of claim 15 wherein the crosslinking agent is a melamine resin of hexamethoxymethylmelamine/styrene allyl alcohol.

17. The phototool of claim 12 wherein the acid catalyst is p-toluenesulfonic acid.

18. A method for providing a protective coating on a diazo-containing material comprising:
coating at least a surface of the diazo-containing material with a composition comprising a cellulose ester, a hydroxylated resin, a crosslinking agent, microcrystalline silica, and an acid catalyst, and
drying the coating at a temperature of about 225° F. to about 275° F. for about 30 seconds to about one minute.

19. The method of claim 18 wherein the hydroxylated resin is a hydroxylated acrylic resin.

20. The method of claim 19 wherein the cellulose ester is a cellulose acetate propionate, cellulose acetate butyrate or cellulose acetate.

21. The method of claim 20 wherein the cellulose ester is a cellulose acetate propionate.

22. The method of claim 19 wherein the crosslinking agent is a melamine crosslinking agent.

23. The method of claim 22 wherein the crosslinking agent is a melamine resin of hexamethoxymethylmelamine/styrene allyl alcohol.

24. The method of claim 19 wherein the acid catalyst is p-toluenesulfonic acid.

25. The method of claim 19 wherein the diazo-containing material is part of a photographic element.

26. The method of claim 25 wherein the photographic element is a phototool.

* * * * *